(12) United States Patent
Ozaki et al.

(10) Patent No.: US 10,896,961 B2
(45) Date of Patent: Jan. 19, 2021

(54) SEMICONDUCTOR DEVICE

(71) Applicant: FUJI ELECTRIC CO., LTD., Kanagawa (JP)

(72) Inventors: Daisuke Ozaki, Okaya (JP); Ryouichi Kawano, Matsumoto (JP)

(73) Assignee: FUJI ELECTRIC CO., LTD.

( * ) Notice: Subject to any disclaimer, the term of this patent is extended or adjusted under 35 U.S.C. 154(b) by 67 days.

(21) Appl. No.: 16/228,807

(22) Filed: Dec. 21, 2018

(65) Prior Publication Data

US 2019/0131412 A1 May 2, 2019

Related U.S. Application Data

(63) Continuation of application No. PCT/JP2017/042179, filed on Nov. 24, 2017.

(30) Foreign Application Priority Data

Jan. 25, 2017 (JP) ................. 2017-011704

(51) Int. Cl.
*H01L 29/40* (2006.01)
*H01L 29/78* (2006.01)
(Continued)

(52) U.S. Cl.
CPC ........ *H01L 29/404* (2013.01); *H01L 29/0615* (2013.01); *H01L 29/0619* (2013.01);
(Continued)

(58) Field of Classification Search
CPC ............... H01L 29/404; H01L 29/0619; H01L 29/0692; H01L 29/0615; H01L 29/7811; H01L 29/7395; H01L 29/8611
See application file for complete search history.

(56) References Cited

U.S. PATENT DOCUMENTS 5,691,553 A * 11/1997 Mori ..................... H01L 29/404
257/328
5,859,446 A * 1/1999 Nagasu ................. H01L 29/417
257/104
(Continued)

FOREIGN PATENT DOCUMENTS

JP H0888346 A 4/1996
JP H09232597 A 9/1997
(Continued)

OTHER PUBLICATIONS

International Search Report for International Patent Application No. PCT/JP2017/042179, issued by the Japan Patent Office dated Feb. 20, 2018.

*Primary Examiner* — Charles D Garber
*Assistant Examiner* — S M Sohel Imtiaz

(57) ABSTRACT

A semiconductor device is provided comprising an active portion and a terminating structure. The semiconductor device is provided comprising the active portion provided in the semiconductor substrate and a terminating structure provided at a termination of the front surface side of the semiconductor substrate and that mitigates an electric field of the termination. In the electric field distribution of the front surface side of the terminating structure, during rated voltage application, an electric field at the end portion of the active portion side may be smaller than a maximum value of an electric field distribution of the front surface side. In addition, the electric field distribution of the terminating structure may have a maximum peak of the electric field on the edge side opposite to the active portion with respect to a center of the terminating structure.

11 Claims, 5 Drawing Sheets

(51) Int. Cl.
    *H01L 29/06*       (2006.01)
    *H01L 29/739*    (2006.01)
    *H01L 29/861*    (2006.01)

(52) U.S. Cl.
    CPC ...... *H01L 29/0692* (2013.01); *H01L 29/7811* (2013.01); *H01L 29/7395* (2013.01); *H01L 29/8611* (2013.01)

(56) References Cited

U.S. PATENT DOCUMENTS

| | | | |
|---|---|---|---|
| 2005/0285189 A1* | 12/2005 | Shibib | H01L 29/7801 257/341 |
| 2010/0314659 A1* | 12/2010 | Yilmaz | H01L 29/1095 257/139 |
| 2011/0291241 A1* | 12/2011 | Yoshikawa | H01L 29/7395 257/544 |
| 2015/0014741 A1* | 1/2015 | Chen | H01L 29/4236 257/139 |
| 2015/0303260 A1* | 10/2015 | Niedernostheide | H01L 23/3157 257/139 |
| 2016/0049463 A1* | 2/2016 | Buchholz | H01L 29/0615 257/488 |

FOREIGN PATENT DOCUMENTS

| | | | |
|---|---|---|---|
| JP | 2003086815 A | 3/2003 |
| JP | 2005101254 A | 4/2005 |
| JP | 2011249580 A | 12/2011 |

\* cited by examiner

SEMICONDUCTOR DEVICE

The contents of the following Japanese patent application(s) are incorporated herein by reference:
2017-011704 filed in JP on Jan. 25, 2017, and
PCT/JP2017/042179 filed on Nov. 24, 2017.

BACKGROUND

1. Technical Field

The present invention relates to a semiconductor device.

2. Related Art

Conventionally, it is known that in a semiconductor device having an active portion a terminating structure is provided to mitigate an electric field concentration at an end portion of the active portion (for example, see the Patent Document 1).
Patent Document 1: Japanese Unexamined Patent Application Publication No. H09-232597

However, in a conventional semiconductor device, it may not have enough withstand voltage due to the electric field concentration at the end portion of the active portion side of the terminating structure.

SUMMARY OF THE INVENTION

In a first aspect of the present invention, a semiconductor device is provided comprising an active portion provided in a semiconductor substrate and a terminating structure provided at a termination of a front surface side of the semiconductor substrate and that mitigates an electric field of the termination. In an electric field distribution of the front surface side of the terminating structure, during rated operation (voltage application), an electric field at an end portion of the active portion side may be smaller than a maximum value of an electric field distribution of the front surface side.

The electric field distribution of the terminating structure may have a maximum peak of the electric field on the edge side opposite to the active portion with respect to a center of the terminating structure.

The terminating structure may comprise: a plurality of guard rings arranged side by side from the active portion side to the edge side opposite to the active portion; and a plurality of first field-plate layers arranged side by side from the active portion side to the edge side and electrically connected to the plurality of guard rings, respectively. First field-plate layers on the active portion side among the plurality of first field-plate layers may overhang to the edge side from corresponding guard rings among the plurality of guard rings. First field-plate layers on the edge side may overhang to the active portion side from correspond guard rings among the plurality of guard rings.

In the first field-plate layers on the active portion side among the plurality of first field-plate layers, the overhang amounts of the first field-plate layers may decrease in order toward the edge side. In the first field-plate layers on the edge side among the plurality of first field-plate layers, the overhang amounts of the first field-plate layers may decrease in order toward the active portion side.

The first field-plate layer closest to the edge side among the plurality of first field-plate layers may overhang to the edge side, while overhanging to the active portion side.

The semiconductor device may further comprises a withstand capability structure provided between the active portion and the terminating structure on the front surface side of the semiconductor substrate.

In the semiconductor substrate, at least the second conductivity type layer of a second conductivity type different from the first conductivity type may be formed on a front surface side of the semiconductor substrate of the first conductivity type. The withstand capability structure may have a well layer as the second conductivity type layer.

The semiconductor device may further comprise: an interlayer dielectric film provided on the front surface side of the semiconductor substrate; and second field-plate layers provided on the interlayer dielectric film and electrically connected to the well layer. The second field-plate layers may overhang to the edge side from the well layer.

A space between the second field-plate layers and the first field-plate layers neighboring the second field-plate layers may be the same as a space between the first field-plate layers.

The widths of the plurality of first field-plate layers may increase toward the edge side.

The widths of the plurality of guard rings may be the same.

The space between the well layer and the guard rings neighboring the well layer and the space between the guard rings may be increase toward the edge side.

During rated voltage application, an electric field distribution on the front surface side of the terminating structure has pulse-like waveforms between the well layer and the guard rings neighboring the well layer and between the guard rings, and a curved line connecting peaks of the pulse-like waveforms may be a convex shape.

The summary clause does not necessarily describe all necessary features of the embodiments of the present invention. The present invention may also be a sub-combination of the features described above.

DESCRIPTION OF EXEMPLARY EMBODIMENTS

The following describes the present invention through embodiments of the invention, but the embodiments described below do not limit the invention according to the scope of the claims. Also, all the combinations of features described in the embodiments are not necessarily required for solutions of the invention.

Figure 1:
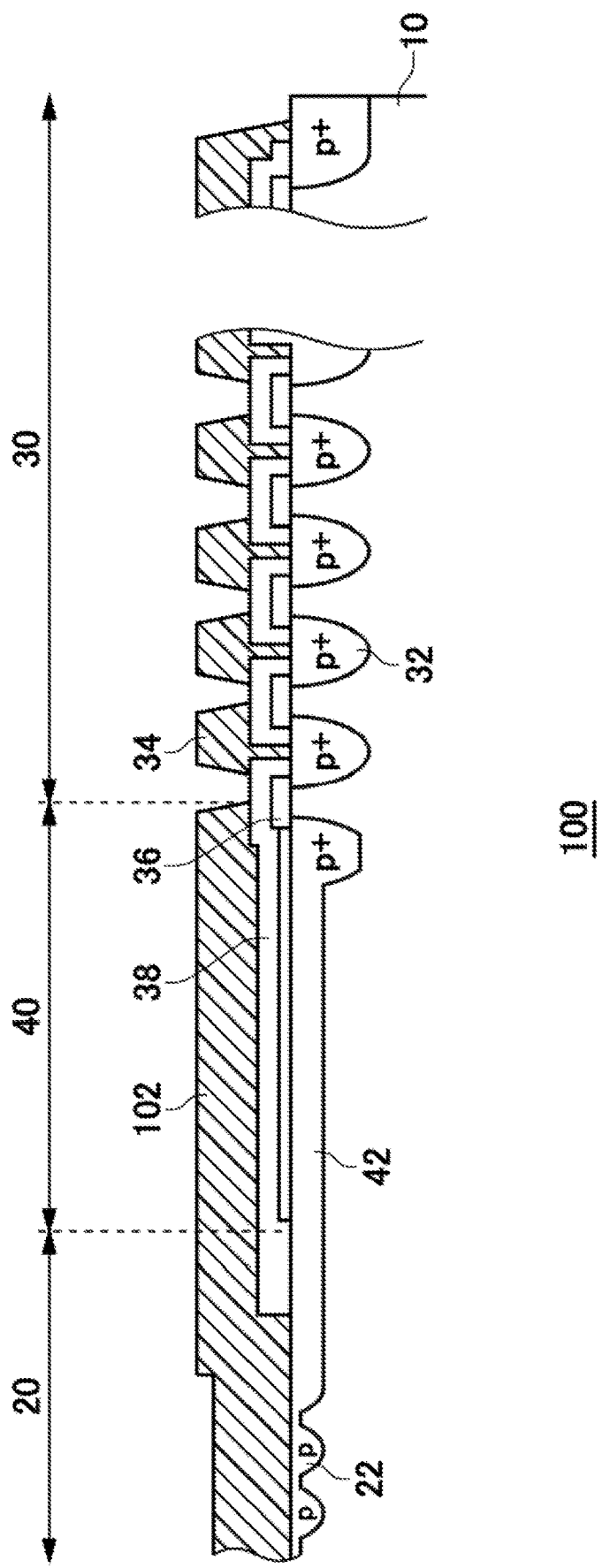
FIG. 1 illustrates a schematic configuration of a semiconductor device 100.

FIG. 1 illustrates a schematic configuration of a semiconductor device 100. The semiconductor device 100 of this example includes an active portion 20, a terminating structure 30, and a withstand capability structure 40, formed in a semiconductor substrate 10.

In the semiconductor substrate 10, a second conductivity type layer of a second conductivity type is formed in the semiconductor substrate of a first conductivity type using such as an ion implantation or diffusion technique. In the semiconductor substrate 10 of this example, at least the second conductivity type layer of a second conductivity type different from the first conductivity type is formed on a front surface side of the semiconductor substrate of the first conductivity type (N-type). As used in this specification, while the first conductivity type is described as N-type and the second conductivity type is described as P-type, the first conductivity type and the second conductivity type may be interchanged. The semiconductor substrate 10 may be a silicon substrate, or may be a silicon carbide substrate, a nitride semiconductor substrate, or the like.

The active portion 20 is a region through which an electrical current flows when the semiconductor device 100 operates. The active portion 20 is provided in the semiconductor substrate 10. In one example, when the semiconductor device 100 is a Reverse Conducting-IGBT (RC-IGBT), transistors and diodes are provided in the active portion 20. The semiconductor device 100 may be a transistor or a diode. The active portion 20 of this example includes base layers 22 provided on the front surface side of the semiconductor device 100. The base layers 22 have the second conductivity type.

The terminating structure 30 mitigates an electric field at the termination on the front surface side of the semiconductor substrate 10. The terminating structure 30 is provided to surround the active portion 20. The terminating structure 30 mitigates electric field concentration at the end portion of the active portion 20. The terminating structure 30 is provided at the termination on the front surface side of the semiconductor substrate 10. In the terminating structure 30, an electric field at an end portion of the active portion side is smaller than a maximum value of an electric field distribution of the front surface side of the semiconductor substrate 10, during rated operation (rated voltage application) of the semiconductor device 100. The terminating structure 30 includes a guard ring 32 and a field-plate layer 34. The terminating structure 30 in this example includes a plurality of guard rings 32 and a plurality of field-plate layers 34.

The guard ring 32 is provided on the front surface side of the semiconductor substrate 10. The guard ring 32 may be provided as a plurality of guard rings 32. The plurality of guard rings 32 are arranged side by side from the active portion side to the edge side. The guard rings 32 have the second conductivity type with high concentration. The guard rings 32 in this example have a P+ conductivity type. In one example, the guard rings 32 are formed by ion-implanting impurities such as boron.

Now, as used in this specification, the edge side refers to the side on which the terminating structure 30 is provided, seen from the active portion 20. That is, the edge side refers to the opposite side to the active portion 20, seen from the terminating structure 30. For example, in a plan view, when the terminating structure 30 surrounds the active portion 20, the edge side refers to the outer side of the semiconductor substrate 10.

On the other hand, the active portion side, as used in this specification, refers to the side on which the active portion 20 is provided, seen from the terminating structure 30. For example, in a plan view, when the terminating structure 30 surrounds the active portion 20, the active portion side refers to the inner side of the semiconductor substrate 10.

The field-plate layers 34 are electrically connected to the guard rings 32. Further, the field-plate layers 34 are set to a predetermined potential. The plurality of field-plate layers 34 are arranged side by side from the active portion side to the edge side. The field-plate layers 34 have the structures overhanging from the guard rings 32. The plurality of field-plate layers 34 in this example overhang to at least either the active portion side or the edge side, depending on the position where each of the field-plate layers 34 is provided. Further, the plurality of field-plate layers 34 may overhang to both the active portion side and the edge side.

For example, the field-plate layers 34 on the active portion side overhang to the edge side from the corresponding guard rings 32. The field-plate layers 34 on the edge side overhang to the active portion side from the corresponding guard rings 32. The corresponding guard rings 32 refer to guard rings 32 connected to the field-plate layers 34, among the plurality of guard rings 32. The field-plate layers 34 are one example of first field-plate layers.

When the number of the plurality of field-plate layers 34 is odd-numbered, the field-plate layers 34 on the active portion side refer to field-plate layers 34 closer to the active portion side than the middle field-plate layer 34. When the number of the plurality of field-plate layers 34 is even-numbered, the field-plate layers 34 on the active portion side refer to field-plate layers 34 closer to the active portion side than the position between two middle field-plate layers 34. Note that the field-plate layers 34 on the active portion side may refer to field-plate layers 34 closer to the active portion side than the center position of the terminating structure 30. On the other hand, when the number of the plurality of field-plate layers 34 is odd-numbered, the field-plate layers 34 on the edge side refer to field-plate layers 34 closer to the edge side than the middle field-plate layer 34. When the number of the plurality of field-plate layers 34 is even-numbered, the field-plate layers 34 on the edge side refer to field-plate layers 34 closer to the edge side than the position between two middle field-plate layers 34. Note that the field-plate layers 34 on the edge side may refer to field-plate layers 34 closer to the edge side than the center position of the terminating structure 30.

Now, overhanging to the edge side means that the edge side end portion of the field-plate layers 34 is provided on the edge side from the edge side end portion of the corresponding guard ring 32. On the other hand, overhanging to the active portion side means that the end portion of the field-plate layers 34 on the active portion side is provided on the active portion side from the end portion of the corresponding guard ring 32 on the active portion side. The overhang of the field-plate layer 34 makes a distance between it and the neighboring guard ring 32 short, so that a depletion layer tends to spread toward the overhung side.

Interlayer dielectric films 36 and 38 are provided on the front surface of the semiconductor substrate 10. While the semiconductor device 100 in this example has the two-layered interlayer dielectric film consisting of the interlayer dielectric films 36 and 38, it may have a single layered interlayer dielectric film. In one example, the interlayer dielectric film 36 is a silicon oxide film, and the interlayer dielectric film 38 is a PSG (Phosphorus Silicon Glass) film. However, materials of the interlayer dielectric films 36 and 38 are not limited thereto.

A front-surface-side electrode 102 is provided on the interlayer dielectric film 38. The front-surface-side electrode 102 in this example is an emitter electrode. In addition, the front-surface-side electrode 102 is electrically connected to a well layer 42. The front-surface-side electrode 102 is one example of a second field-plate layer. The front-surface-side electrode 102 overhangs to the edge side from the well layer 42. This facilitates a spread of a depletion layer to the edge side, at the end portion of the withstand capability structure 40 on the edge side. Thus, the electric field is mitigated at the end portion of the well layer 42 on the edge side. Each thickness and material of the interlayer dielectric films 36 and 38 may be selected so that a predetermined electric field distribution is obtained.

The withstand capability structure 40 prevents electrical elements from being destroyed during reverse recovery operation of the semiconductor device 100. The withstand capability structure 40 is provided between the active portion 20 and the terminating structure 30. The withstand capability structure 40 is provided on the front surface side of the semiconductor substrate 10. When applying current, the withstand capability structure 40 serves as a current-limiting resistor to prevent or reduce hole-injection into the terminating structure 30. Providing the withstand capability structure 40 reduces the concentration of hole-electron pairs in the terminating structure 30. This can allow the semiconductor device 100 to prevent or reduce heat generation due to current crowding during reverse recovery operation and prevent electrical elements from being destroyed. The withstand capability structure 40 in this example has the well layer 42.

The well layer 42 is provided on the front surface side of the semiconductor substrate 10. The well layer 42 has the second conductivity type with high concentration. The well layer 42 in this example has a P+ conductivity type. The well layer 42 is provided in the withstand capability structure 40. In addition, the well layer 42 is also provided at the end portion of the active portion 20 on the side of the withstand capability structure 40. That is, the well layer 42 is formed from the withstand capability structure 40 to the active portion 20. The well layer 42 extracts avalanche carriers generating at the end portion of the edge side of the well layer 42. This prevents the end portion of the edge side of the active portion 20 from being applied high voltage to be destroyed.

The semiconductor device 100 in this example sets the guard rings 32 and field-plate layers 34 to the same potential by electrically connecting the guard rings 32 and field-plate layers 34. Thus, how to extend the depletion layer in the terminating structure 30 is adjustable by adjusting the width and space of the guard rings 32 and the field-plate layers 34. The semiconductor device 100 in this example adjusts the arrangement of the guard rings 32 and the field-plate layers 34 so that the maximum peak of the electric field during reverse recovery operation shifts to the terminating structure 30.

Example 1

Figure 2:
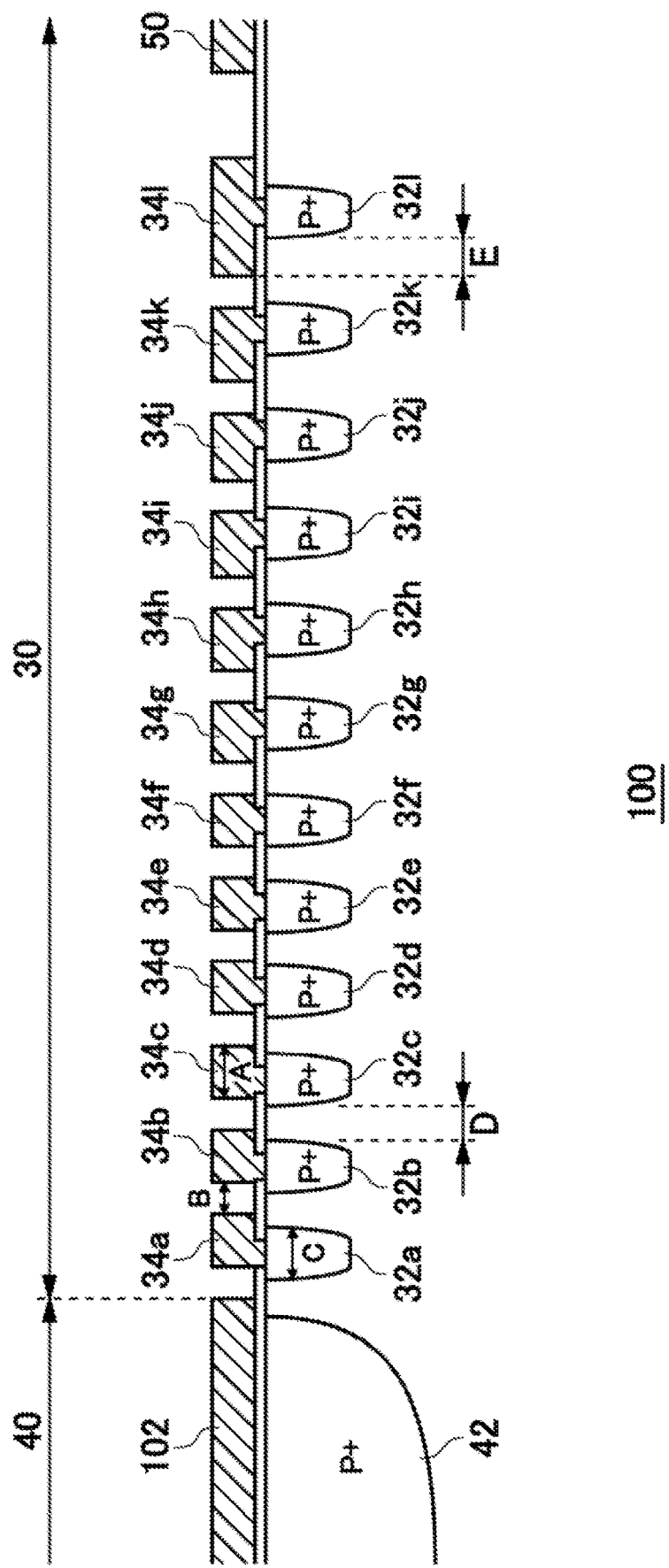
FIG. 2 illustrates one example of a configuration of the semiconductor device 100 according to Example 1.

FIG. 2 illustrates one example of a configuration of a semiconductor device 100 according to Example 1. The guard rings 32 in this example have twelve guard rings: guard ring 32*a* to guard ring 32*l* (labeled as 32*a*, 32*b*, . . . , in order from an active portion 20 side). Also, the field-plate layers 34 in this example have twelve field-plate layers: field-plate layer 34*a* to field-plate layer 34*l* (labeled as 34*a*, 34*b*, . . . , in order from the active portion 20 side). A channel stopper 50 is provided at the end portion of the edge side of the semiconductor device 100.

The widths A indicate the cross-sectional widths of the field-plate layers 34. The plurality of field-plate layers 34*a* to 34*l* are arranged respectively with the width Aa to Al (Aa represents the width of 34*a*, Ab represents the width of 34*b*, Ac represents the width of 34*c*, Ad represents the width of 34*d*, Ae represents the width of 34*e*, Af represents the width of 34*f*, Ag represents the width of 34*g*, Ah represents the width of 34*h*, Ai represents the width of 34*i*, Aj represents the width of 34*j*, Ak represents the width of 34*k*, and Al represents the width of 34*l*). The widths A of the field-plate layers 34 increase in order from the active portion side to the edge side. That is, the widths Aa to Al of the field-plate layers 34 have a following relation: Aa<Ab<Ac<Ad<Ae<Af<Ag<Ah<Ai<Aj<Ak<Al. This makes a depletion layer tend to extend more on the edge side than on the active portion side of the terminating structure 30.

The spaces B indicate spaces between neighboring field-plate layers 34. The plurality of field-plate layers 34*a* to 34*l* are arranged respectively with the spaces Bab to Bkl (Bab represents the space between 34*a* and 34*b*, Bbc represents the space between 34*b* and 34*c*, Bcd represents the space between 34*c* and 34*d*, Bde represents the space between 34*d* and 34*e*, Bef represents the space between 34*e* and 34*f*, Bfg represents the space between 34*f* and 34*g*, Bgh represents the space between 34*g* and 34*h*, Bhi represents the space between 34*h* and 34*i*, Bij represents the space between 34*i* and 34*j*, Bjk represents the space between 34*j* and 34*k*, and Bkl represents the space between 34*k* and 34*l*).

All of the spaces Bab to Bkl between field-plate layers 34 in this example are equal. That is, the spaces Bab to Bkl between the field-plate layers 34 have a following relation: Bab=Bbc=Bcd=Bde=Bef=Bfg=Bgh=Bhi=Bij=Bjk=Bkl. However, the spaces Bab-Bkl between field-plate layers 34 may be different.

In addition, the space between a front-surface-side electrode 102 and the field-plate layer 34*a* neighboring the front-surface-side electrode 102 may be designed considering an electric field distribution on the front surface side of the semiconductor substrate 10. For example, the space between the front-surface-side electrode 102 and the field-plate layer 34*a* neighboring the front-surface-side electrode 102 is the same as spaces, Bab to Bkl, between the field-plate layers 34.

The widths C indicate the cross-sectional widths of the guard rings 32. The plurality of guard ring 32*a* to 32*l* are arranged respectively with the widths Ca to Cl (Ca represents the width of 32*a*, Cb represents the width of 32*b*, Cc represents the width of 32*c*, Cd represents the width of 32*d*, Ce represents the width of 32*e*, Cf represents the width of 32*f*, Cg represents the width of 32*g*, Ch represents the width of 32*h*, Ci represents the width of 32*i*, Cj represents the width of 32*j*, Ck represents the width of 32*k*, and Cl represents the width of 32*l*). In this example, all of the cross-sectional widths C of the guard rings 32 are equal among all guard rings 32*a* to 32*l*. That is, the widths Ca to Cl of the guard rings 32 have a following relation: Ca=Cb=Cc=Cd=Ce=Cf=Cg=Ch=Ci=Cj=Ck=Cl. However, the widths Ca to Cl of the guard rings 32 may be different.

The spaces D indicate the spaces of the neighboring guard rings 32. The plurality of guard rings 32*a* to 32*l* are arranged respectively with the spaces Dab to Dkl (Dab represents the space between 32*a* and 32*b*, Dbc represents the space between 32*b* and 32*c*, Dcd represents the space between 32*c* and 32*d*, Dde represents the space between 32*d* and 32*e*, Def represents the space between 32*e* and 32*f*, Dfg represents the space between 32*f* and 32*g*, Dgh represents the space between 32*g* and 32*h*, Dhi represents the space between 32*h* and 32*i*, Dij represents the space between 32*i* and 32*j*, Djk represents the space between 32*j* and 32*k*, and Dkl represents the space between 32*k* and 32*l*). In this example, the spaces Dab to Dkl of the guard rings 32 increase in order toward the edge side. That is, the spaces Dab to Dkl between the guard rings 32 have a following relation: Dab<Dbc<Dcd<Dde<Def<Dfg<Dgh<Dhi<Dij<Djk<Dkl. That is, the spaces between the guard rings 32 decrease in order from the edge side to the active portion side on which the potential tends to be high. This makes it easier for the electric field to concentrate on the edge side of the terminating structure 30. Note that the relation among the spaces Dab to Dkl in this example are merely one example and at least one of the spaces Dab to Dkl between the guard rings 32 may be equal to another one.

Also, a space between the well layer 42 and the guard ring 32a neighboring the well layer 42 may be also designed considering the electric field distribution on the front surface side of the semiconductor substrate 10. For example, the space between the well layer 42 and the guard ring 32a neighboring the well layer 42 is smaller than the space Dab between the guard ring 32a and the guard ring 32b. That is, the space between the well layer 42 and the guard ring 32a neighboring the well layer 42, and the spaces Dab to Dkl of the guard rings 32 become larger toward the edge side.

Among the plurality of field-plate layers 34, the field-plate layers 34 near the active portion side (34a to 34f) overhang to the edge side from the guard rings 32 electrically connected to them. This allows the maximum peak of the electric field to shift from the end portion of the well layer 42 to the edge side. In addition, by causing the field-plate layers 34 on the active portion side to overhang to the edge side, the region for the front-surface-side electrode 102 to overhang to the edge side can be ensured.

On the other hand, the field-plate layers 34 near the edge side (34g to 34l) overhang to the active portion side from the guard rings 32 electrically connected to them. This allows the maximum peak of the electric field in the terminating structure 30 to shift to the edge side of the terminating structure 30.

The overhang amounts E indicate the overhang amounts of the field-plate layers 34 with respect to the guard rings 32. The overhang amounts E of the field-plate layers 34 may be changed depending on the position at which the field-plate layers 34 are provided in the terminating structure 30. In one example, in the field-plate layers 34 on the active portion side among the plurality of field-plate layers 34, the overhang amounts E of the field-plate layers 34 decrease in order toward the edge side. For example, the overhang amounts Ea to Ef of the field-plate layers 34a to 34f have a following relation: Ea>Eb>Ec>Ed>Ee>Ef (Ea represents the overhang amount of the 34a, Eb represents the overhang amount of the 34b, Ec represents the overhang amount of the 34c, Ed represents the overhang amount of the 34d, Ee represents the overhang amount of the 34e, and Ef represents the overhang amount of the 34f).

Further, in the field-plate layers 34 on the edge side among the plurality of field-plate layers 34, the overhang amounts of the field-plate layers 34 decrease in order toward the active portion side. For example, the overhang amounts Eg to El of the field-plate layers 34g to 34l have a following relation: Eg<Eh<Ei<Ej<Ek<El (Eg represents the overhang amount of the 34g, Eh represents the overhang amount of the 34h, Ei represents the overhang amount of the 34i, Ej represents the overhang amount of the 34j, Ek represents the overhang amount of the 34k, and El represents the overhang amount of the 34l).

In other words, in this example, the field-plate layers 34 are arranged so that the overhang amounts E of the field-plate layers 34 are larger at both ends of the terminating structure 30 and the field-plate layers 34 overhang to the center side of the terminating structure 30. In addition, the field-plate layers 34 are arranged so that the overhang amounts are smaller near the center of the terminating structure 30 and the field-plate layers 34 overhang to the center side of the terminating structure 30. This allows the maximum peak of the electric field in the terminating structure 30 to be provided near the center of the terminating structure 30. Note that the field-plate layer 34l closest to the edge side among the plurality of field-plate layers 34 overhangs to the edge side, while overhanging to the active portion side.

Note that in this example the number of field-plate layers 34 overhanging to the active portion side equals to the number of field-plate layers 34 overhanging to the edge side. However, if the structure allows the maximum peak of the electric field during reverse recovery operation to be shifted to the terminating structure 30, the number of field-plate layers 34 overhanging to the active portion side may be different from the number of field-plate layers 34 overhanging to the edge side.

As described above, the semiconductor device 100 in this example shifts the maximum peak of the electric field during reverse recovery operation to the edge side of the terminating structure 30 by optimizing the structure of the terminating structure 30. This prevents or reduces avalanche carriers flowing into the withstand capability structure 40 and prevents electrical elements from being destroyed during reverse recovery operation. Thus, the semiconductor device 100 in this example enables improvement of reverse recovery withstand capability and achievement of low-loss and high-speed switching operation (i.e., high di/dt).

Comparative Example 1

Figure 3:
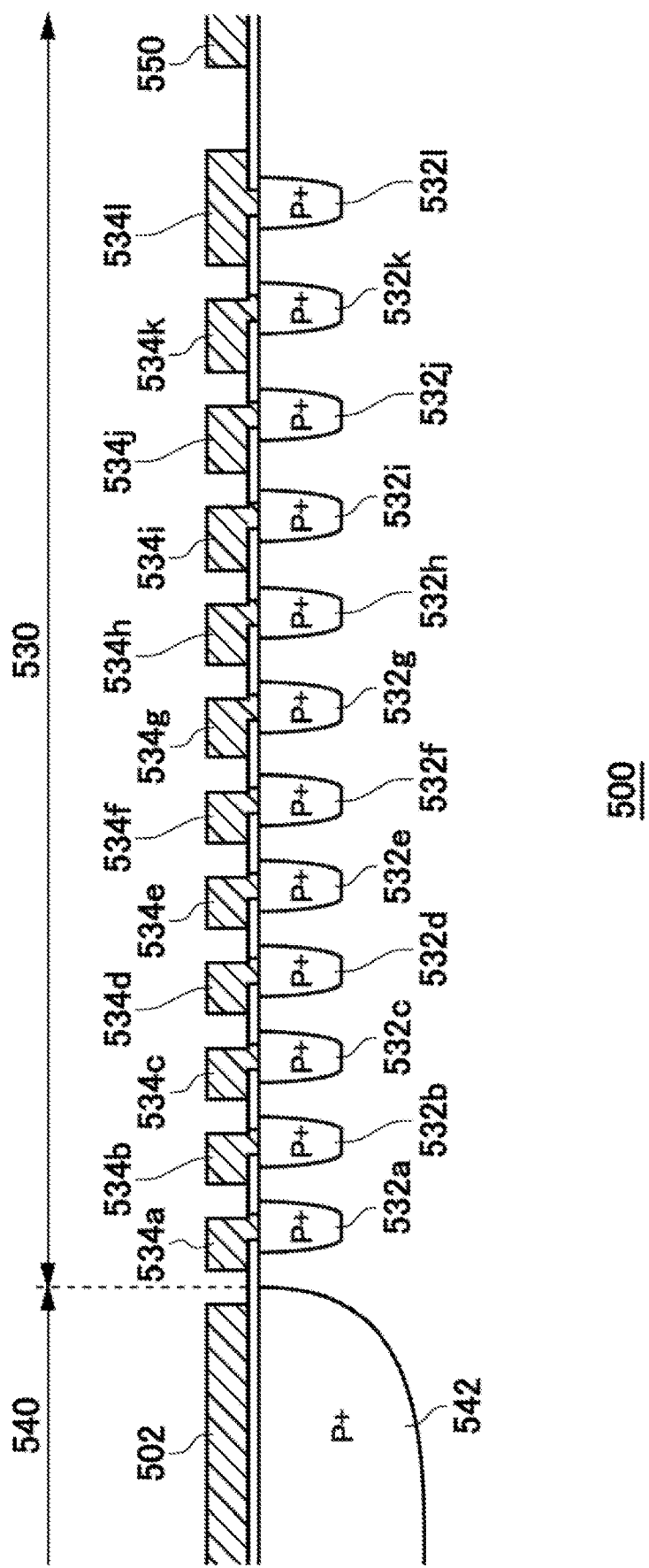
FIG. 3 illustrates a configuration of a semiconductor device 500 according to Comparative Example 1.

FIG. 3 illustrates a configuration of a semiconductor device 500 according to Comparative Example 1. The semiconductor device 500 in this example includes a front-surface-side electrode 502, well layer 542, a plurality of guard rings 532, a plurality of field-plate layers 534, and a channel stopper 550. The semiconductor device 500 in this example is different from the semiconductor device 100 according to Example 1 in that all of the field-plate layers 534 overhang to an active portion side.

The guard rings 532 in this example include 12 guard rings, 532a to 532l. Also, the field-plate layers 534 in this example include 12 field-plate layers, 534a to 534l. The field-plate layers 534a to 534l overhang to the active portion side from respectively corresponding guard rings 532a to 532l.

Now, in the semiconductor device 500, electric field concentration may occur at the end portion of the edge side of the well layer 542 during reverse recovery operation. In this case, avalanche occurs at the end portion of the edge side of the well layer 542, which causes carrier generation. Since the generated avalanche carriers are extracted through the well layer 542 to the anode side of the active portion, the potential of the withstand capability structure 540 goes up and carriers stored in the terminating structure 530 are extracted to the anode side not through the well layer 542. In this case, since the well layer 542 is filled with the avalanche carriers and this is equivalent to the situation that the withstand capability structure 540 does not fulfill its function, carriers are not extracted, thereby leading to destruction of electrical elements.

Figure 4:
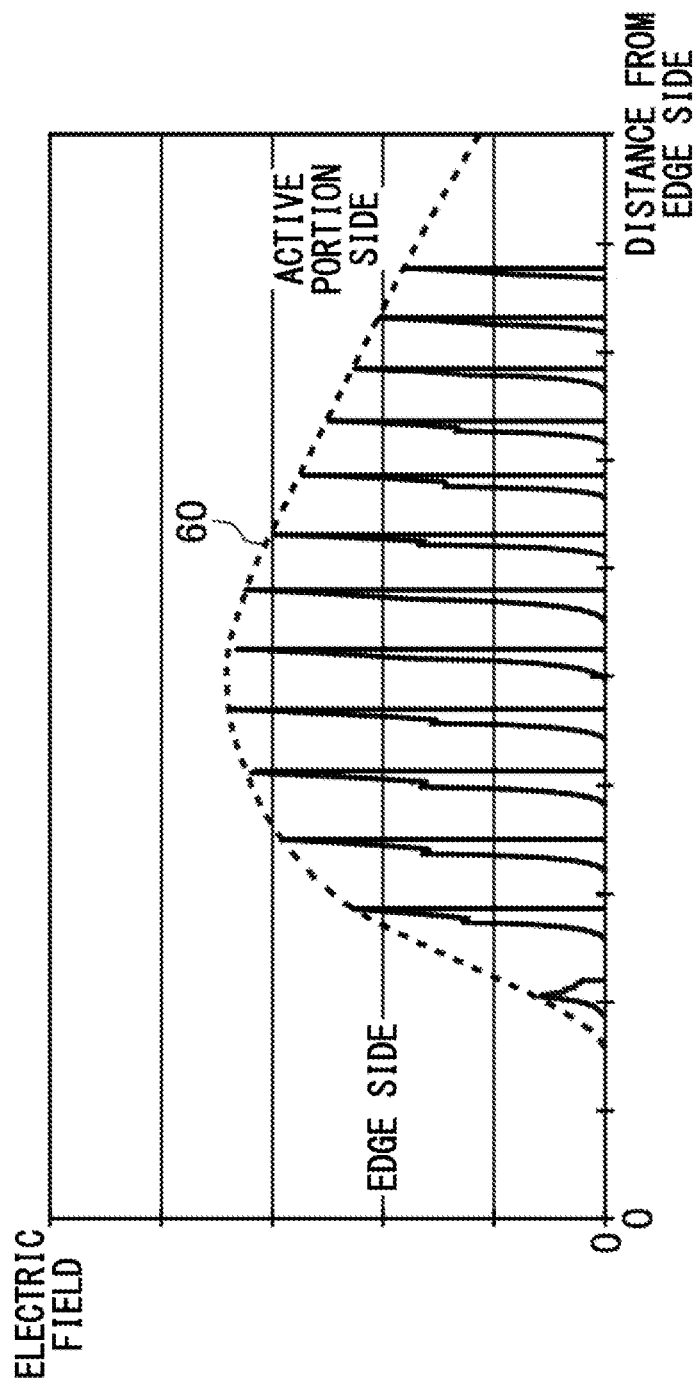
FIG. 4 illustrates one example of an electric field distribution of the semiconductor device 100 according to Example 1.
Figure 5:
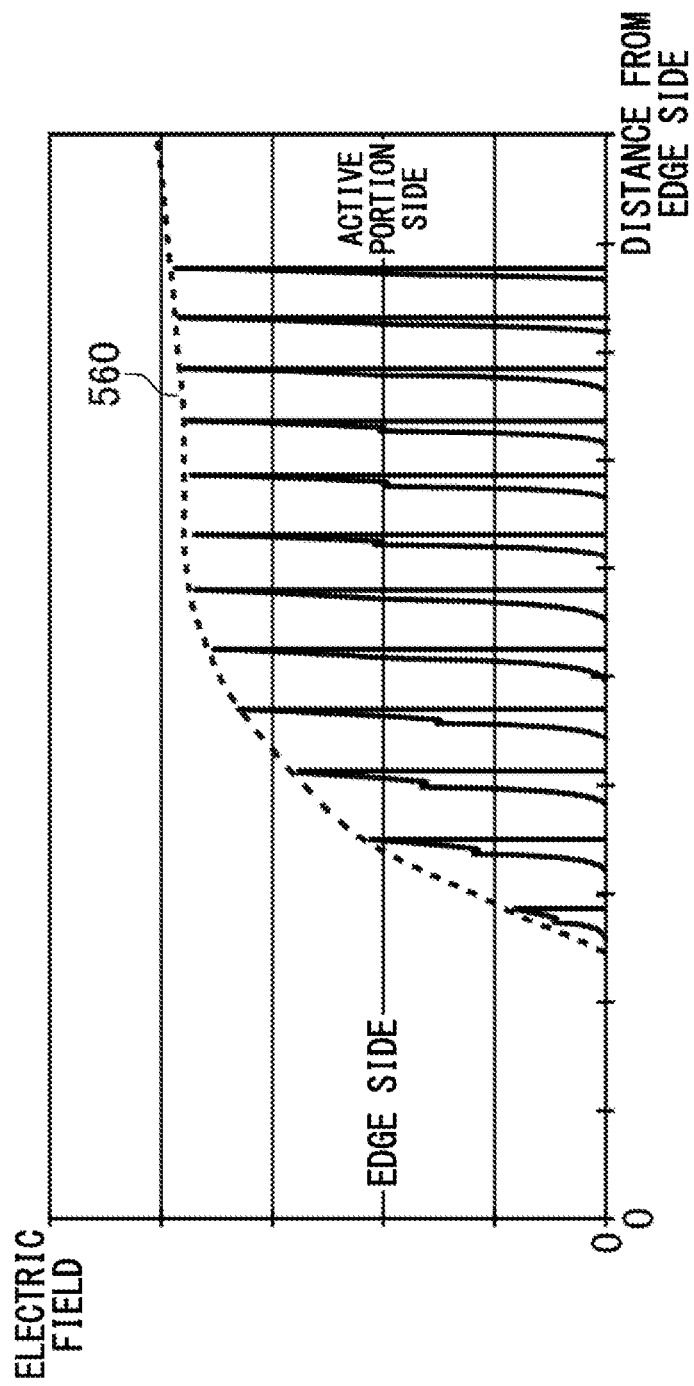
FIG. 5 illustrates one example of an electric field distribution of the semiconductor device 500 according to Comparative Example 1.

FIG. 4 illustrates one example of an electric field distribution of the semiconductor device 100 according to Example 1. FIG. 5 illustrates one example of an electric field distribution of the semiconductor device 500 according to Comparative Example 1. The vertical axis indicates the electric field and the horizontal axis indicates distance from the end portion of the edge side of the terminating structure 30. The electric field distribution of the semiconductor device 100 in this example shows the distribution of the electric field near the front surface of the semiconductor substrate. The position near the front surface of the semiconductor substrate may be a depth of 1 μm or less, 0.1 μm or less, or 0.01 μm or less from the front surface of the semiconductor substrate.

In the semiconductor device 100 according to Example 1, the electric field is mitigated on the active portion side of the terminating structure 30. And, the electric field at the end portion of the active portion side of the terminating structure 30 is smaller than the maximum value of the electric field distribution on the front surface side of the semiconductor substrate 10. This can prevent or reduce generation of the avalanche carriers at the end portion of the active portion side of the terminating structure 30. In this example, the electric field distribution on the front surface side of the terminating structure 30, during rated voltage application, has pulse-like waveforms between the well layer 42 and the guard ring 32 neighboring the well layer 42, and between guard rings 32. A curved line 60 is a curved line connecting the peaks of the pulse-like waveforms in the electric field distribution of the semiconductor device 100. The curved line 60 in this example has a convex shape.

Since the curved line 60 has the convex shape, the electric fields on the active portion side and edge side of the terminating structure 30 are mitigated more than the electric field at the center of the terminating structure 30. For example, the peak of the electric field at the point closest to the active portion side of the terminating structure 30 is mitigated to less than or equal to two thirds of the maximum peak in the electric field distribution of the terminating structure 30. Also, the electric field distribution of the terminating structure 30 may have the maximum peak of the electric field on the edge side with respect to the center of the terminating structure 30. The electric field of the terminating structure 30 tends to increase on the active portion side. However, by setting the maximum peak of the electric field to the edge side with respect to the center of the terminating structure 30, the electric field distribution in the terminating structure 30 can be easily distributed uniformly.

On the other hand, in the semiconductor device 500 according to Comparative Example 1, the electric field at the end portion on the active portion side of the terminating structure 530 is not mitigate. A curved line 560 is the curved line connecting the peaks of the pulse-like waveforms in the electric field distribution of the semiconductor device 500. The curved line 560 does not have a convex shape, the electric field concentration occurs on the active portion side of the terminating structure 530. This causes avalanche carriers to be generated at the end portion on the edge side of the well layer 542 in the semiconductor device 500. Thus, the well layer 542 is filled with avalanche carriers, which causes carriers in the semiconductor substrate not to be extracted, then destruction of electrical elements may occurs.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 20: active portion, 22: base layer, 30: terminating structure, 32: guard ring, 34: field-plate layer, 36: interlayer dielectric film, 38: interlayer dielectric film, 40: withstand capability structure, 42: well layer, 50: channel stopper, 60: curved line, 100: semiconductor device, 102: front-surface-side electrode, 500: semiconductor device, 502: front-surface-side electrode, 530: terminating structure, 532: guard ring, 534: field-plate layer, 540: withstand capability structure, 542: well layer, 550: channel stopper, 560: curved line

What is claimed is:

1. A semiconductor device comprising:
   an active portion provided in a semiconductor substrate; and
   a terminating structure provided at a termination on a front surface side of the semiconductor substrate, wherein the terminating structure mitigates an electric field at the termination, the terminating structure comprising:
      a plurality of guard rings arranged side by side, from the active portion side to an edge side opposite to the active portion; and
      a plurality of first field-plate layers arranged side by side from the active portion side to the edge side and electrically connected to the plurality of guard rings, respectively,
   wherein in an electric field distribution on the front surface side of the terminating structure during rated voltage application, an electric field at an end portion of the active portion side is smaller than a maximum value of the electric field distribution on the front surface side,
   wherein first field-plate layers on the active portion side among the plurality of first field-plate layers overhang to the edge side from corresponding guard rings among the plurality of guard rings and an overhang amount of each first field-plate layer on the active portion side decreases as a distance toward the edge side decreases, and
   wherein first field-plate layers on the edge side among the plurality of first field-plate layers overhang to the active portion side from corresponding guard rings among the plurality of guard rings and an overhang amount of each first field-plate layer on the edge side decreases as a distance toward the active portion side decreases.

2. The semiconductor device according to claim 1, wherein the electric field distribution of the terminating structure has the maximum peak of the electric field on an edge side opposite to the active portion with respect to a center of the terminating structure.

3. The semiconductor device according to claim 1, wherein a first field-plate layer closest to the edge side among the plurality of first field-plate layers overhangs to the edge side while overhanging to the active portion side.

4. The semiconductor device according to claim 1, further comprising a withstand capability structure provided between the active portion and the terminating structure on the front surface side of the semiconductor substrate.

5. The semiconductor device according to claim 4,
wherein in the semiconductor substrate, at least a second conductivity type layer of a second conductivity type different from a first conductivity type is formed on the front surface side of the semiconductor substrate of the first conductivity type,
wherein the withstand capability structure has a well layer as the second conductivity type layer.

6. The semiconductor device according to claim 5, further comprising:
an interlayer dielectric film provided on the front surface of the semiconductor substrate; and
second field-plate layers provided on the interlayer dielectric film and electrically connected to the well layer,
wherein the second field-plate layers overhang to the edge side from the well layer.

7. The semiconductor device according to claim 6, wherein a space between the second field-plate layers and the first field-plate layers neighboring the second field-plate layers is the same as a space between the first field-plate layers.

8. The semiconductor device according to claim 5, wherein the plurality of first field-plate layers have larger widths as they are toward the edge side.

9. The semiconductor device according to claim 5, wherein the plurality of guard rings each have the same width.

10. The semiconductor device according to claim 5, wherein a space between the well layer and the guard rings neighboring the well layer, and a space between the guard rings become larger as they are toward the edge side.

11. The semiconductor device according to claim 5, wherein an electric field distribution on the front surface side of the terminating structure has, during rated voltage application, pulse-like waveforms between the well layer and the guard rings neighboring the well layer and between the guard rings, wherein a curved line connecting peaks of the pulse-like waveforms is a convex shape.

* * * * *